US011282817B2

(12) United States Patent
Chen et al.

(10) Patent No.: US 11,282,817 B2
(45) Date of Patent: Mar. 22, 2022

(54) SEMICONDUCTOR DEVICE PACKAGE INCLUDING EMBEDDED CONDUCTIVE ELEMENTS

(71) Applicant: TAIWAN SEMICONDUCTOR MANUFACTURING COMPANY, LTD., Hsinchu (TW)

(72) Inventors: Yu-Feng Chen, Hsinchu (TW); Chun-Hung Lin, Taipei (TW); Han-Ping Pu, Taichung (TW); Ming-Da Cheng, Jhubei (TW); Kai-Chiang Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 110 days.

(21) Appl. No.: 16/774,983

(22) Filed: Jan. 28, 2020

(65) Prior Publication Data
US 2020/0168583 A1   May 28, 2020

Related U.S. Application Data

(60) Continuation of application No. 15/230,695, filed on Aug. 8, 2016, now Pat. No. 10,553,561, which is a
(Continued)

(51) Int. Cl.
*H01L 25/065* (2006.01)
*H01L 23/00* (2006.01)
(Continued)

(52) U.S. Cl.
CPC ........ *H01L 25/0657* (2013.01); *H01L 21/565* (2013.01); *H01L 23/3107* (2013.01);
(Continued)

(58) Field of Classification Search
None
See application file for complete search history.

(56) References Cited

U.S. PATENT DOCUMENTS 8,349,721 B2   1/2013 Shim et al.
8,592,995 B2   11/2013 Lin
(Continued)

FOREIGN PATENT DOCUMENTS

| DE | 19754372 | 9/1998 |
| TW | 201113963 | 4/2011 |
| TW | 201118963 | 6/2011 |

OTHER PUBLICATIONS

Office Action dated Apr. 29, 2016 from corresponding No. CN 201210189750.9.
(Continued)

*Primary Examiner* — Long Pham
(74) *Attorney, Agent, or Firm* — Hauptman Ham, LLP

(57) ABSTRACT

A semiconductor device includes a first semiconductor die package. The first semiconductor package includes a molding compound, and a conductive element in the molding compound, wherein a top surface of the conductive element is above or co-planar with a top-most surface of the molding compound. The semiconductor device further includes a second semiconductor die package. The second semiconductor package includes a plurality of copper-containing contacts on a single metal pad, wherein each of the plurality of copper-containing contacts is bonded to the conductive element.

20 Claims, 8 Drawing Sheets

Related U.S. Application Data division of application No. 13/406,031, filed on Feb. 27, 2012, now Pat. No. 9,418,947.

(51) Int. Cl.

| | | |
|---|---|---|
| *H01L 25/10* | (2006.01) | |
| *H01L 21/56* | (2006.01) | |
| *H01L 23/31* | (2006.01) | |
| *H01L 25/00* | (2006.01) | |
| *H01L 23/498* | (2006.01) | |

(52) U.S. Cl.
CPC .............. *H01L 24/03* (2013.01); *H01L 24/05* (2013.01); *H01L 24/11* (2013.01); *H01L 24/13* (2013.01); *H01L 24/16* (2013.01); *H01L 24/81* (2013.01); *H01L 25/105* (2013.01); *H01L 25/50* (2013.01); *H01L 23/49816* (2013.01); *H01L 23/562* (2013.01); *H01L 2224/0384* (2013.01); *H01L 2224/0391* (2013.01); *H01L 2224/03334* (2013.01); *H01L 2224/0401* (2013.01); *H01L 2224/05075* (2013.01); *H01L 2224/05147* (2013.01); *H01L 2224/05166* (2013.01); *H01L 2224/05181* (2013.01); *H01L 2224/05571* (2013.01); *H01L 2224/06181* (2013.01); *H01L 2224/1184* (2013.01); *H01L 2224/1191* (2013.01); *H01L 2224/11334* (2013.01); *H01L 2224/131* (2013.01); *H01L 2224/13005* (2013.01); *H01L 2224/13012* (2013.01); *H01L 2224/13013* (2013.01); *H01L 2224/13014* (2013.01); *H01L 2224/13022* (2013.01); *H01L 2224/13023* (2013.01); *H01L 2224/13078* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/16145* (2013.01); *H01L 2224/16147* (2013.01); *H01L 2224/16225* (2013.01); *H01L 2224/17181* (2013.01); *H01L 2224/32145* (2013.01); *H01L 2224/73204* (2013.01); *H01L 2224/81191* (2013.01); *H01L 2224/81193* (2013.01); *H01L 2224/81815* (2013.01); *H01L 2225/06513* (2013.01); *H01L 2225/06517* (2013.01); *H01L 2225/1023* (2013.01); *H01L 2225/1058* (2013.01); *H01L 2225/1088* (2013.01); *H01L 2924/00014* (2013.01); *H01L 2924/014* (2013.01); *H01L 2924/04941* (2013.01); *H01L 2924/04953* (2013.01); *H01L 2924/12042* (2013.01); *H01L 2924/1305* (2013.01); *H01L 2924/1306* (2013.01); *H01L 2924/13091* (2013.01); *H01L 2924/14* (2013.01); *H01L 2924/15311* (2013.01); *H01L 2924/181* (2013.01)

(56) References Cited

U.S. PATENT DOCUMENTS

| | | |
|---|---|---|
| 2002/0121695 A1 | 9/2002 | Stephenson et al. |
| 2002/0151164 A1 | 10/2002 | Jiang et al. |
| 2006/0275949 A1 | 12/2006 | Farnworth |
| 2007/0063332 A1 | 3/2007 | Go et al. |
| 2007/0166877 A1 | 7/2007 | Otremba |
| 2007/0187826 A1* | 8/2007 | Shim .................. H01L 23/3128 257/738 |
| 2007/0200257 A1 | 8/2007 | Chow et al. |
| 2009/0283572 A1 | 11/2009 | Volek |
| 2010/0244216 A1 | 9/2010 | Huang et al. |
| 2011/0117700 A1 | 5/2011 | Weng et al. |
| 2011/0149493 A1 | 6/2011 | Kwon et al. |
| 2012/0025398 A1 | 2/2012 | Jang et al. |
| 2013/0105973 A1 | 5/2013 | Gan |
| 2013/0187268 A1 | 7/2013 | Lin et al. |
| 2013/0234329 A1* | 9/2013 | Bezama ............ H01L 21/76804 257/738 |
| 2013/0295723 A1 | 11/2013 | Khan |
| 2014/0015113 A1 | 1/2014 | Kuno |
| 2014/0015130 A1 | 1/2014 | Eng |

OTHER PUBLICATIONS

Office Action dated Aug. 1, 2014 and English translation from corresponding No. DE 10 2012 104 731.6.
German Office Action.
Office Action dated Jul. 30, 2014 from corresponding application No. TW 101116457.
Office Action dated Nov. 30, 2016 and English translation from corresponding application No. DE 10 2012 104 731.6.

* cited by examiner

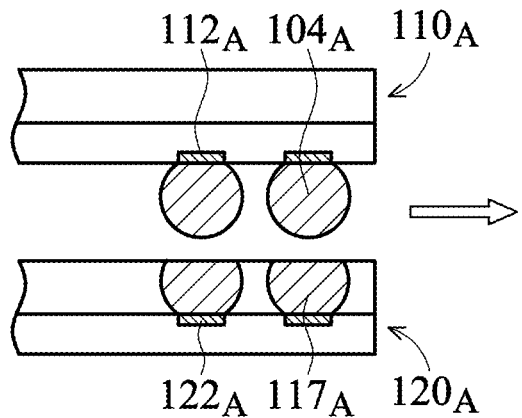 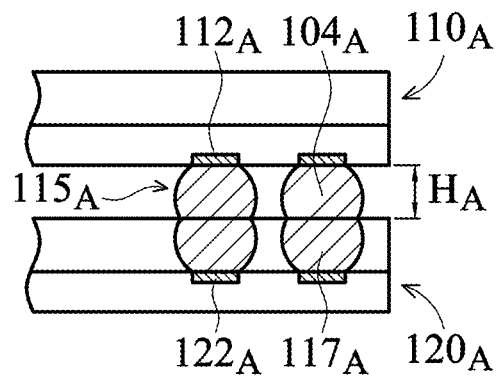
Fig. 3A Fig. 3B
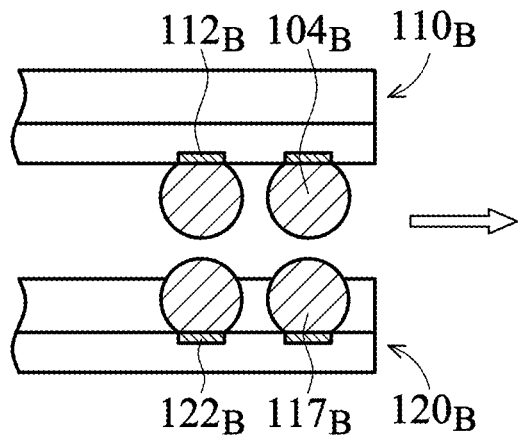 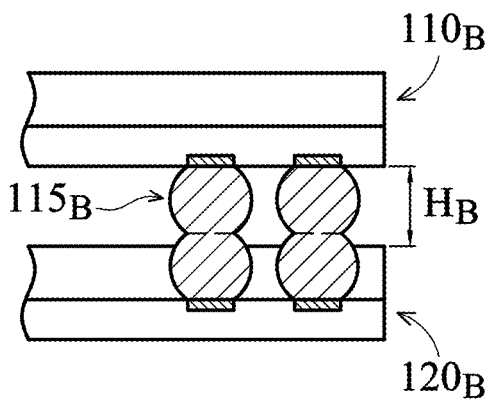
Fig. 3C Fig. 3D
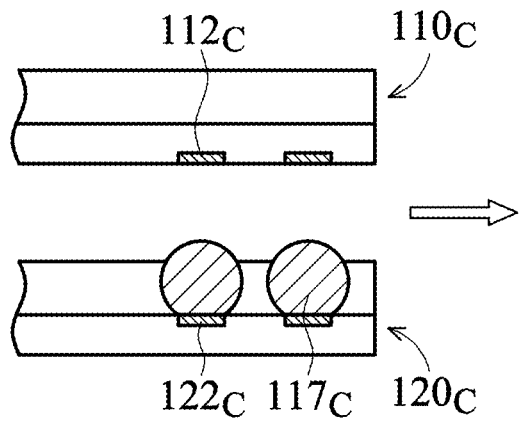 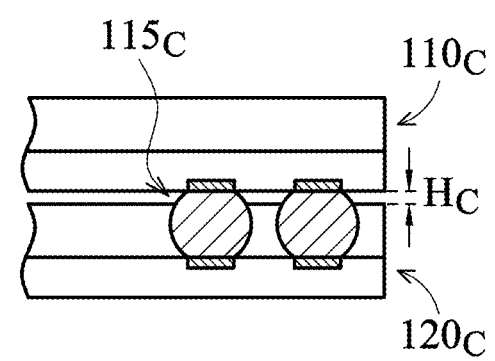
Fig. 3E Fig. 3F

SEMICONDUCTOR DEVICE PACKAGE INCLUDING EMBEDDED CONDUCTIVE ELEMENTS

PRIORITY CLAIM

This application is a continuation of U.S. application Ser. No. 15/230,695, filed Aug. 8, 2016, which is a divisional of U.S. application Ser. No. 13/406,031, filed Feb. 27, 2012, now U.S. Pat. No. 9,418,947, issued Aug. 16, 2016, which are incorporated herein by reference in their entireties.

RELATED APPLICATIONS

This application relates to the following co-pending and commonly assigned patent application: Ser. No. 13/228,244, entitled "Packaging Methods and Structures Using a Die Attach Film" and filed on Sep. 8, 2011, which is incorporated herein in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area and/or lower height than packages of the past, in some applications.

Thus, new packaging technologies, such as package on package (PoP), have begun to be developed, in which a top package with a device die is bonded to a bottom package with another device die. By adopting the new packaging technologies, the integration levels of the packages may be increased. These relatively new types of packaging technologies for semiconductors face manufacturing challenges.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 3A, 3B, 3C, 3D, 3E and 3F show cross-sectional views of packages processed based on three process sequences of forming connectors, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Figure 1A:
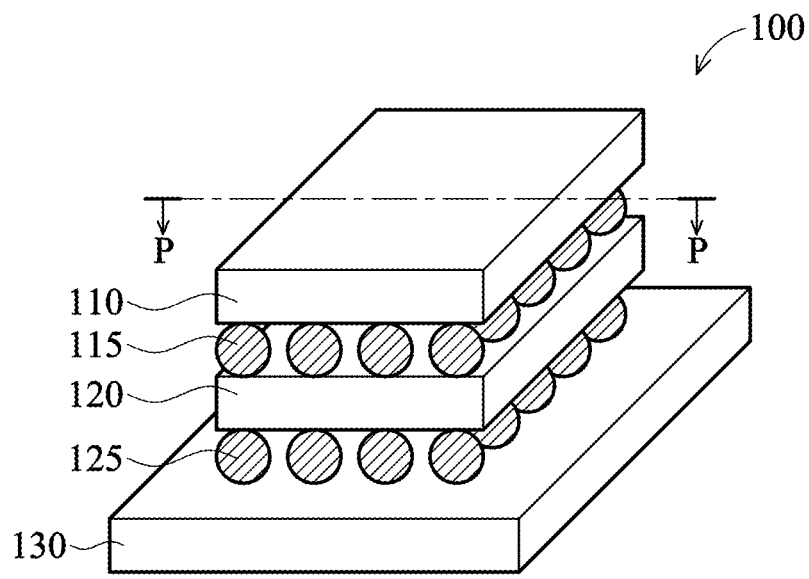
FIG. 1A shows a perspective view of a package, in accordance with some embodiments.

FIG. 1A shows a perspective view of a package 100 having a package 110 bonded to another package 120, which is further bonded to a substrate 130 in accordance with some embodiments. Each package, such as package 110 or package 120, includes at least a semiconductor die (not shown). The semiconductor die includes a substrate as employed in a semiconductor integrated circuit fabrication, and integrated circuits may be formed therein and/or thereupon. The semiconductor substrate is defined to mean any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The substrate 130 may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the substrate 130 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Substrate 130 may be made of a semiconductor wafer, or a portion of wafer. In some embodiments, substrate 130 includes silicon, gallium arsenide, silicon on insulator ("SOI") or other similar materials. In some embodiments, substrate 130 also includes passive devices such as resistors, capacitors, inductors and the like, or active devices such as transistors. In some embodiments, substrate 130 includes additional integrated circuits. Substrates 130 may further include through substrate vias (TSVs) and may be an interposer. In addition, the substrate 130 may be made of other materials. For example, in some embodiments, substrate 130 is a multiple-layer circuit board. In some embodiments, substrate 130 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

Figure 1B:
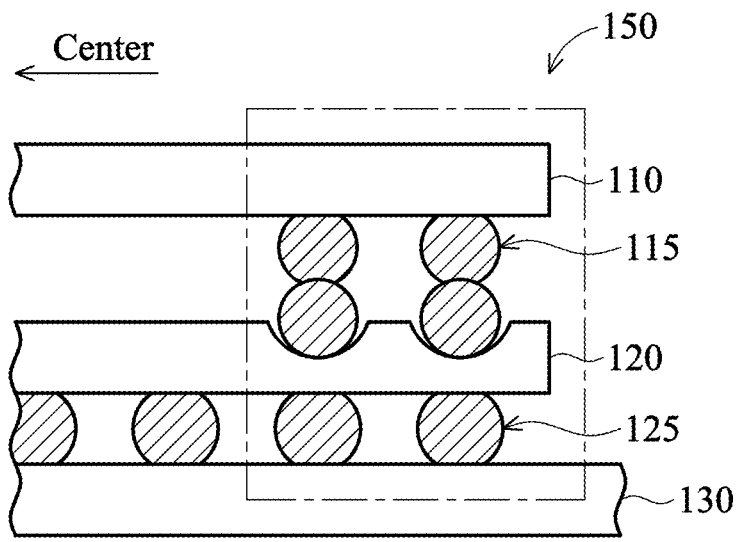
FIG. 1B shows a cross-sectional view of a portion of package of FIG. 1A cut along line P-P, in accordance with some embodiments.

Package 110 is bonded to package 120 via connectors 115, and package 120 is bonded to substrate 130 via connectors 125. FIG. 1B shows a cross-sectional view of a portion of package of FIG. 1A cut along line P-P, in accordance with some embodiments. FIG. 1B shows connectors 115 and 125 near the edge of package 100. There are connectors 125 near the center of package 120, in some embodiments. A region 150 in FIG. 1B is marked by a rectangle and details of region 150 are shown in FIG. 1C, in accordance with some embodiments.

Figure 1C:
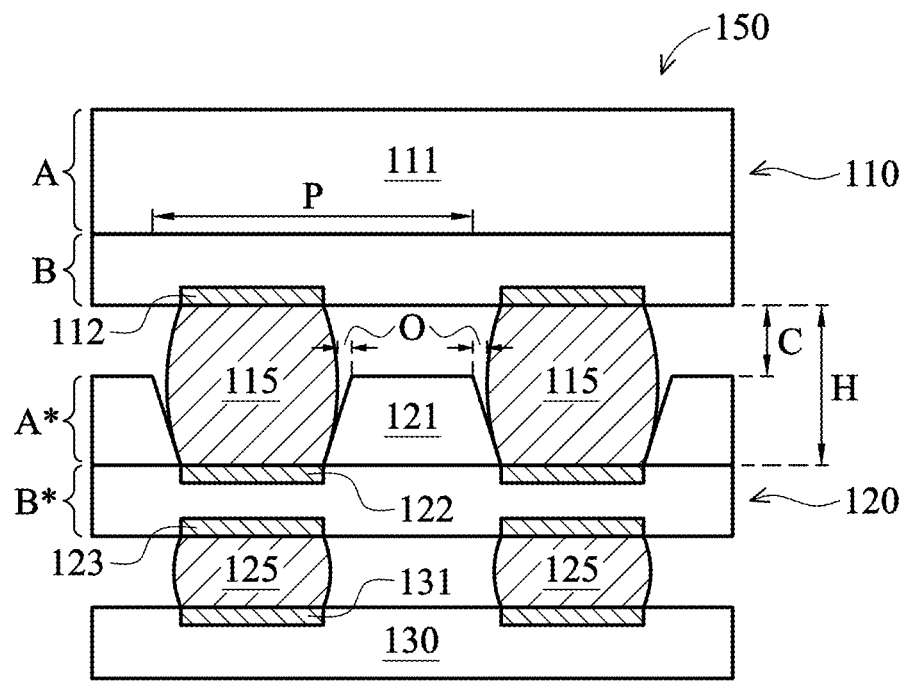
FIG. 1C shows an enlarged cross-sectional view of section 150 of FIG. 1B, in accordance with some embodiments.

FIG. 1C shows details of region 150 of FIG. 1B, in accordance with some embodiments. Package 110 includes a semiconductor die region A, which has a semiconductor die (not shown) covered by a molding compound 111. Molding compound 111 is initially in liquid form and is dried after being dispensed on the semiconductor die to cover at least a portion of the semiconductor die, in accordance with some embodiments. For example, the molding compound 111 may initially include epoxy, filler, solvent etc. In some embodiments, molding compound 111 may be formed by transfer molding, where measured molding material (usually a thermoset plastic) is pre-heated to liquid form before being applied on the substrate. The molding material is heated after being applied to finalize the molding process. Various resins may be used as the molding compound materials.

Package 110 also includes a redistribution region B, which have interconnect structures, such as one or more redistribution layers (RDLs) that make connections between the semiconductor die in the package with connectors 115. Similarly, package 120 includes a semiconductor die region A*, which has a semiconductor die (not shown) embedded in a molding compound 121. Package 120 also includes a redistribution region B*, which also have interconnect structures, such as one or more redistribution layers (RDLs) that make connections between the semiconductor die in the package with connectors 125.

Exemplary mechanisms of forming packages 110 and 120 may be found in U.S. patent application Ser. No. 13/228,244, entitled "Packaging Methods and Structures Using a Die Attach Film" and filed on Sep. 8, 2011, which is incorporated herein in its entirety.

Figure 1D:
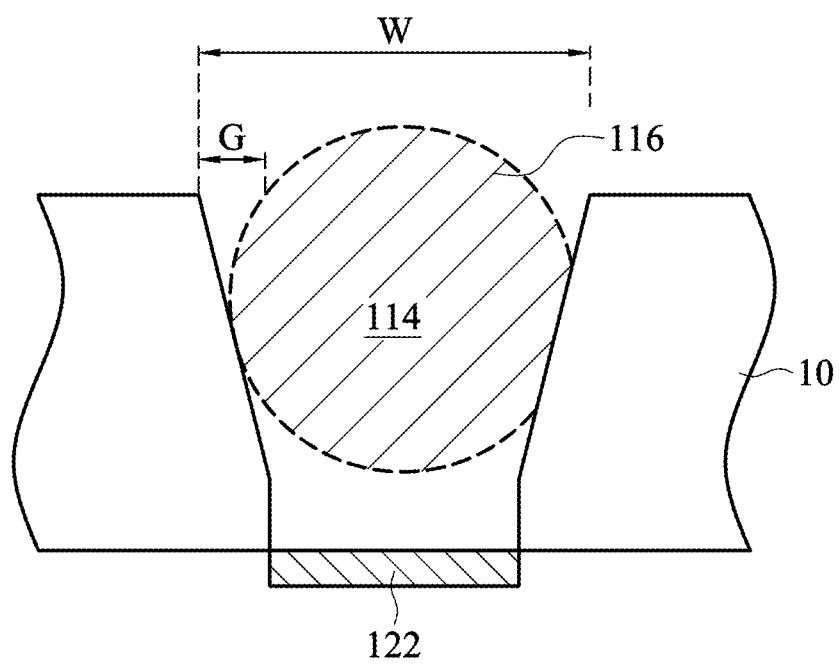
FIG. 1D shows an opening formed by using laser drill to form a connector with a conductive object, in accordance with some embodiments.

FIG. 1C shows that connectors 115 come in contact with metal pads 112 of package 110 and metal pads 122 of package 120, and connectors 125 come in contact with metal pads 122 of package 120 and metal pads 131 of substrate 130. Metal pads 112 are electrically connected to devices in a semiconductor die (not shown) in package 110. Metal pads 122 are electrically connected to devices in a semiconductor die (not shown) in package 120. FIG. 1C shows that parts of connectors 115 are embedded in the molding compound 121 of package 120. The openings for embedding connectors 115 are formed by laser drill, in accordance with some embodiments. FIG. 1D shows an opening 114 for embedding a connector 115 formed by using laser drill to remove molding compound 112, in accordance with some embodiments. The opening 114 has a cross-sectional profile that is larger at top and smaller at the bottom for ease for placing a conductive element, such as a solder ball, in the opening. Due to the process limitation of laser drill, a width W of top portion of the opening 114 is in the range from about 0.2 mm to about 0.4 mm, in some embodiments. After opening 114 is formed, a conductive object 116 (depicted by dotted lines), such as a solder ball, is placed in the opening 114. The diameter of the conductive object 116 is smaller than the width W of opening 114. The distance between the top portion of the opening and the conductive object 116 is distance "G", as shown in FIG. 1D. After reflow, the conductive object 116 makes contact with a conductive material over metal pad 112 of package 110 to form connectors 115. FIG. 1C shows that connectors 115 contact metal pads 122 after reflow and has a gap "O" with the top surface of molding compound 121. In some other embodiments, the conductive objects 116 makes direct contact with metal pads 112, which do not have another conductive material over their surfaces, to form connectors 115.

The pitch P of connectors 115 is limited by the width W of openings 114. In some embodiments, the widest width W of the opening is in a range from about 0.23 mm to about 0.50 mm. In some embodiments, the pitch P is in a range from about 0.35 mm to about 0.6 mm. In some embodiments, the height H is set to be sufficient to keep the overall package height low for form factor. The height C between packages 110 and 120 is also affected by the size of connectors placed in openings 114. In some embodiments, height C is in a range from about 0.25 mm to about 0.35 mm.

Figure 2A:
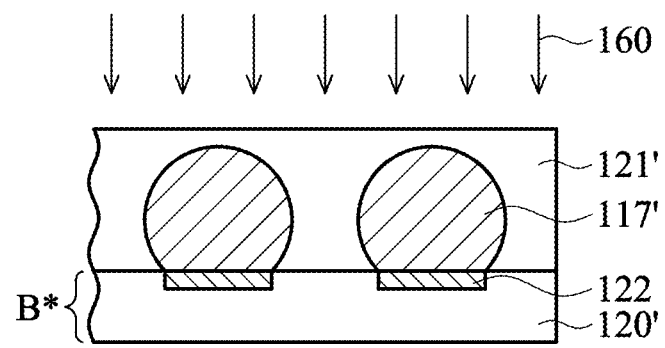
FIG. 2A shows a die package with conductive elements embedded inside molding compound, in accordance with some embodiments.

For advanced packaging, it is desirable to reduce the pitch P between connectors to allow smaller package size and additional connections. Therefore, new mechanisms for forming connectors 115 with smaller pitch P are desirable. FIG. 2A shows a die package 120' with conductive elements 117' embedded inside molding compound 121', in accordance with some embodiments. Conductive elements 117' are formed or disposed on metal pads 122 before the molding compound 121' is formed on region B* of package 120'. For example, conductive elements 117' may be plated on metal pads 122 and reflowed to ball shape. Molding compound 121' is formed over the conductive elements 117' afterwards. Alternatively, metal balls may be placed on metal pads 122 and then bonded to metal pads 122 to form conductive elements 117'. The conductive elements 117' can be made of any conductive materials with low resistivity. For example, they can be made of solder, solder alloy, gold, gold alloy, etc. Exemplary elements included in a solder alloy may include Sn, Pb, Ag, Cu, Ni, bismuth (Bi), or combinations thereof.

Figure 2B:
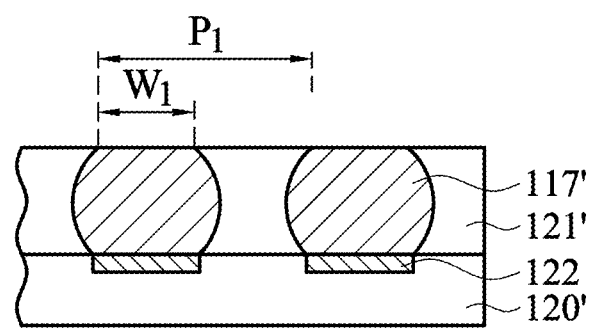
FIG. 2B shows that the molding compound having been partially removed to expose conductive elements, in accordance with some embodiments.

FIG. 2B shows that the molding compound 121' having been partially removed to expose the conductive elements 117', in accordance with some embodiments. The removal process 160 can be any applicable processes, such as grinding, polishing, etc. The exposed conductive elements 117' have a width $W_1$.) Since the conductive elements 117' are embedded in the molding compounds 121' before being exposed, no laser drill is required to create the openings for the conductive elements 117'. As a result, there is no gap between the top surface of molding compound 121' and the conductive elements 117' as in the case of FIG. 1C, which has a gap "O". In addition, the size (or width) $W_1$ of conductive elements 117' can be smaller than conductive element 116 because it is no longer affected by the size of opening 114 due to laser drill limitation. As a result, the pitch $P_1$ can be made smaller than pitch P of FIG. 1C. In some embodiments, pitch $P_1$ is in a range from about 100 μm to about 500 μm. In some embodiments, width $W_1$ is in a range from about 100 μm to about 400 μm, which is equal to or smaller than width W of the opening in FIG. 1D described above.

Figure 2C:
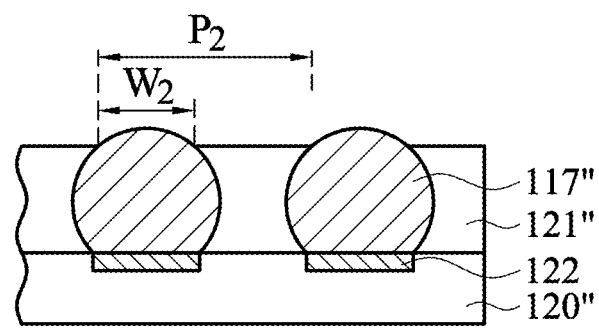
FIG. 2C shows a die package with conductive elements embedded in a molding compound, in accordance with some embodiments.

In an alternative embodiment, the conductive elements 117" may be partially embedded in the molding compound and a portion of the conductive elements 117" may be exposed, as shown in FIG. 2C in some embodiments. A mold or film can be pressed against the molding compound 121" and the conductive elements 117" during the formation of the molding compound 121" to enable a portion of the conductive elements 117" to be exposed. The width of the exposed conductive elements 117" is $W_2$. Since the conductive elements 117" are embedded in the molding compound 121", pitch $P_2$ of the conductive elements 117" is also smaller than pitch P of FIG. 1C described above. In some embodiments, pitch $P_2$ is in a range from about 100 μm to about 500 μm. In some embodiments, width $W_2$ is in a range from about 100 μm to about 400 μm.

FIG. 3A shows package $110_A$ with contacts $104_A$ and package $120_A$ with conductive elements $117_A$, in accordance with some embodiments. Contacts $104_A$ are formed cover metal pads 122A and are made of conductive material(s). In some embodiments, contacts $104_A$ are made of solder. Conductive elements $117_A$ of package $120_A$ are formed by a process described in FIGS. 2A and 2B in some embodiments. Contacts $104_A$ and conductive elements $117_A$ are bonded together by reflow to form connectors $115_A$, as shown in FIG. 3B in accordance with some embodiments. The height of connector $115_A$ is $H_A$.

FIG. 3C shows package $110_B$ with contacts $104_B$ and package $120_B$ with conductive elements $117_B$, in accordance with some embodiments. Contacts $104_B$ are formed cover metal pads $122_B$ and are made of conductive material(s). In some embodiments, contacts $104_B$ are made of solder. Conductive elements $117_B$ of package $120_B$ are formed by a process described in FIG. 2C in some embodiments. Contacts $104_B$ and conductive elements 117 are bonded together by reflow to form connectors $115_B$, as shown in FIG. 3D in accordance with some embodiments. The height of connector $115_B$ is $H_B$.

In some alternative embodiments, package 110c does not have contacts (such as contacts $104_B$) on metal pads $122_C$, as shown in FIG. 3E in accordance with some embodiments. Conductive elements $117_C$ directly come in contact with metal pads $112_C$ to form connectors 115c, as shown in FIG. 3F. The height of connector $115_C$ is $H_C$.

Figure 4A:
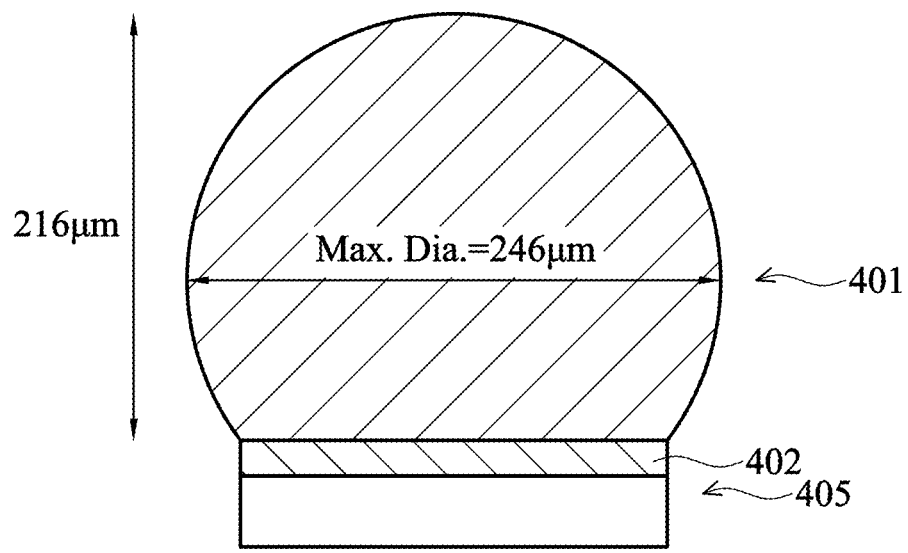
FIG. 4A shows a solder ball over a metal pad, in accordance with some embodiments.

FIG. 4A shows a solder ball 401 over a metal pad 405 after reflow, in accordance with some embodiments. The width of the metal pad 405 is about 200 μm and it includes an under bump metallization (UBM) layer 402. UBM layer 402 may contain an adhesion layer and/or a wetting layer. In some embodiments, UBM layer 402 may also act as a diffusion barrier layer. In some embodiments, the UBM layer 402 is made of titanium (Ti), titanium nitride (TiN), tantalum nitride (TaN), tantalum (Ta), or the like. In some embodiments, UBM layer 402 further includes a copper seed layer.

In some embodiments, the thickness of UBM layer 402 is in a range from about 0.05 μm to about 0.5 μm. Solder ball 401 is formed by reflowing a round solder ball with a diameter of about 250 μm over the UBM layer 402. The solder would spread across the surface of the UBM layer 402 and the surface tension makes the solder ball 401 have a diameter of about 246 μm, as shown in FIG. 4A. The height of solder ball 401 is about 216 μm. The profile of reflowed solder ball on an UBM layer can be simulated by simulation tools, such as SURFACE EVOLVER or ANSYS FLUENT. SURFACE EVOLVER is an interactive program for study of surfaces shaped by surface tension and other energies, and subject to various constraints. SURFACE EVOLVER is developed at THE GEOMETRY CENTER at the UNIVERSITY OF MINNESOTA. ANSYS FLUENT is a simulation tool own by ANSYS INC. OF CANONSBURG, PENNSYLVANIA. Such simulation tools can be used to simulate solder balls with different width and height.

Figure 4B:
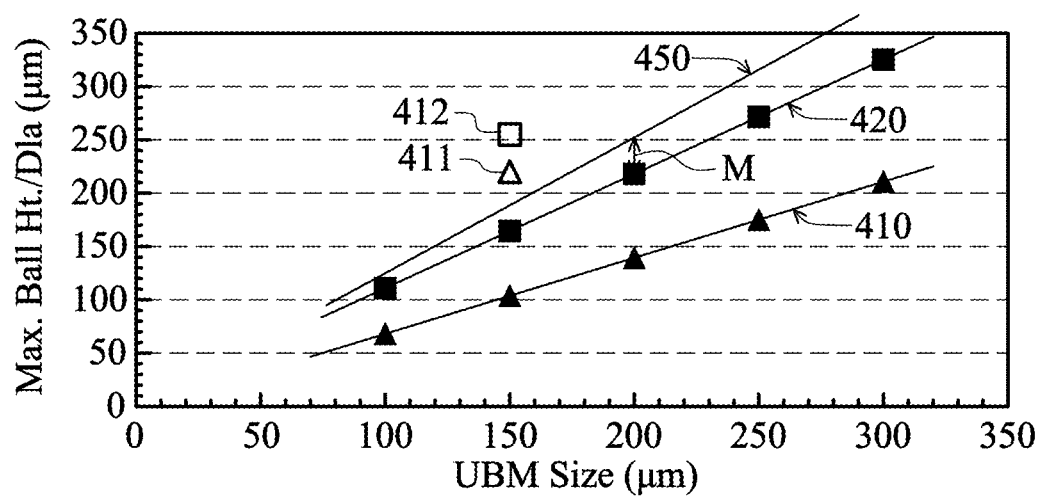
FIG. 4B show a diagram of maximum solder ball height and diameter as a function of under bump metallization (UBM) layer size, in accordance with some embodiments.

FIG. 4B show a diagram of simulated (reflowed) solder ball height as a function of diameter (i.e., the maximum width) and UBM size (or width), in accordance with some embodiments. Curve 410 shows ball height for various UBM sizes when the diameters of solder balls (before reflow) are the same as the widths (or sizes) of the UBM layers underneath. Curve 410 shows that when a solder ball with a diameter of 200 μm is reflowed to be bonded to a UBM layer (circular in shape) with a diameter of 200 μm, the reflowed ball height is 152 μm. When the diameter of the ball before reflow is 250 μm, the height after reflow (on 250 μm UBM layer) is 186 μm. Curve 420 shows that when a solder ball with a diameter of 200 μm is reflowed to be bonded to a UBM layer (circular in shape) with a diameter of 200 μm, the reflowed ball width is 218 μm. When the diameter of the ball before reflow is 250 μm, the maximum width after reflow (on 250 μm UBM layer) is 274 μm. Since the ball sizes before reflow for curves 410 and 420 correlate with widths (or sizes) of the UBM layers, curves 410 and 420 are linear.

FIG. 4B also show a datum 411, which is the ball height after reflow of a ball of diameter 250 μm before reflow being bonded to an UBM layer with a diameter of 150 mm. Data 411 shows that the height is 223 μm. FIG. 4B also shows a datum 412 of the maximum width of the reflowed solder ball of datum 412. Datum 412 shows that the maximum width is 256 μm. Data 411 and 412 show that the height and diameter also depend on the pre-reflow ball size.

The data of maximum ball widths after reflow help to determine the minimal pitch required to prevent shorting. A margin can be added to a maximum width to reach the minimal pitch for connectors. Curve 450 shows an exemplary curve for pitch, in accordance with some embodiments. A margin (M) is added to the maximum connector width and the total width is the minimal pitch. The margin M could change with the ball size (pre-reflow). In some embodiments, the margin M is a percentage of the maximum width of reflow solder balls. In some embodiments, the margin M is in a range from about 5% to about 70% of the maximum width. In some other embodiments, the margin M is in a range from about 5% to about 30% of the maximum width.

Figure 5:
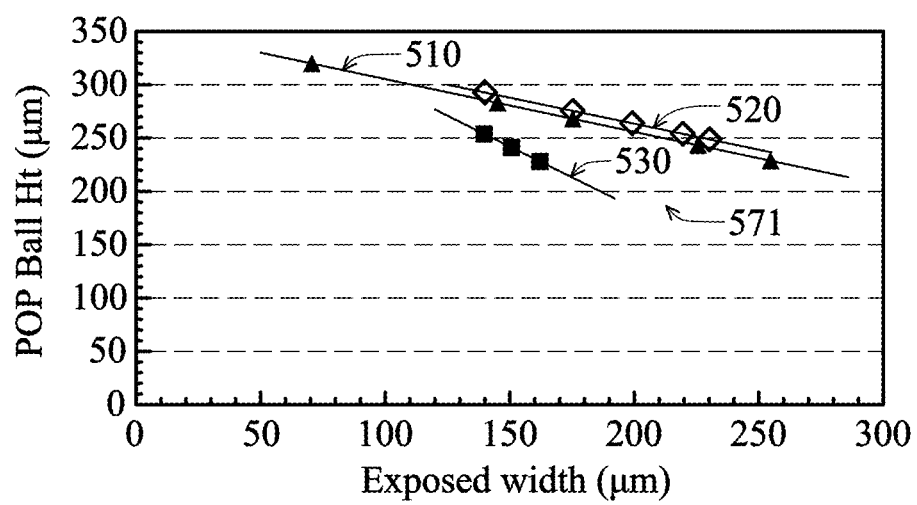
FIG. 5 shows the height of reflowed connectors as a function of exposed width of pre-reflow solder ball, in accordance with some embodiments.

FIG. 5 shows simulated height $H_B$ of reflowed connectors $115_B$ as a function of exposed width (or diameter) of pre-reflow solder ball $W_2$ (as shown in FIG. 2C) in accordance with some embodiments. The data of filled triangles in FIG. 5 are data of connects formed by package $120_B$ and package $110_B$. The data of filled triangles are on curve 510. The embedded solder balls in package $120_B$ for curve 510 data have a diameter of 250 μm and the UBM layer also has a diameter of 250 μm. The solder balls for package $110_B$ for curve 510 data have a diameter of 200 μm and the UBM layer with a diameter of 250 μm. The data show that height $H_B$ decreases with the increase in the exposed widths $W_2$ of embedded solder balls.

Curve 520 includes data of open triangles for embedded solder balls with a diameter of 250 μm on UBM layers with a diameter of 200 μm, which is smaller than 250 mm for curve 510. The diameter of solder ball for solder balls of package 110B for curve 520 is also 200 μm. Curve 520 almost overlaps with curve 510, which indicates the impact of different UBM widths is minimal when the difference is 50 μm.

FIG. 5 also shows datum 511 for connectors $115_C$ of FIG. 3F when package $110_C$ does not have a solder ball on each of metal pad $112_C$. Package 120c for datum 511 also has solder balls with a diameter of 250 μm on a UBM layer with a diameter of 200 μm. Without solder balls on package $120_C$, the height of connectors $115_C$ is lowered by about 80 μm (compared to curves 510 and 520). FIG. 5 also shows curve 530 with data of filled squares. The embedded solder balls in package $120_B$ for curve 530 data have a diameter of 250 μm and the UBM layer also has a diameter of 200 μm. The pre-reflow solder balls on package $120_B$ for curve 530 is smaller than the pre-reflow solder balls on package $120_B$ of curves 510 and 520. The solder balls for package $110_B$ for curve 530 data have a diameter of 200 μm on a UBM layer with a diameter of 250 mm. The solder balls on package $110_B$ of curve 530 are similar to those of curves 510 and 520. Due to the reduced solder ball size on package 120B, the data on curve 530 are lower than data on curves 510 and 520.

As mentioned above, it is desirable to have lower overall package height to achieve small form factor. FIG. 5 shows that higher exposed widths of embedded solder balls result in lower connect height. Therefore, to lower connector heights, the widths of exposed embedded solder balls could be increased. When the exposed widths equal to or greater than about 100 μm for the packages described above, the overall connect height is equal to or less than about 300 μm.

Figure 6A:
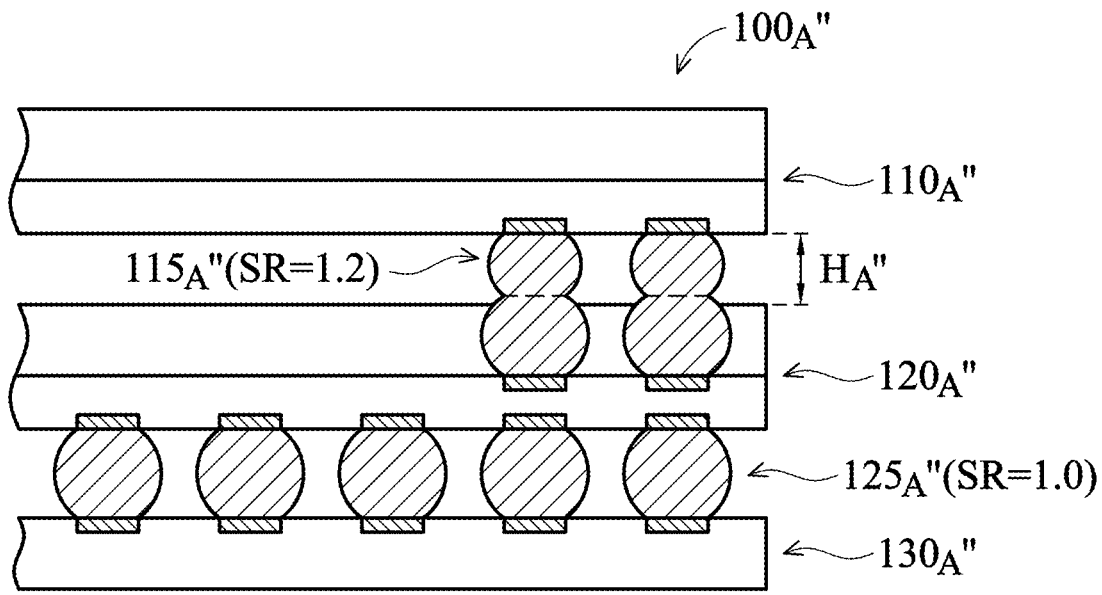
FIGS. 6A and 6B show two exemplary packages for stress simulation on connectors thereof, in accordance with some embodiments.
Figure 6B:
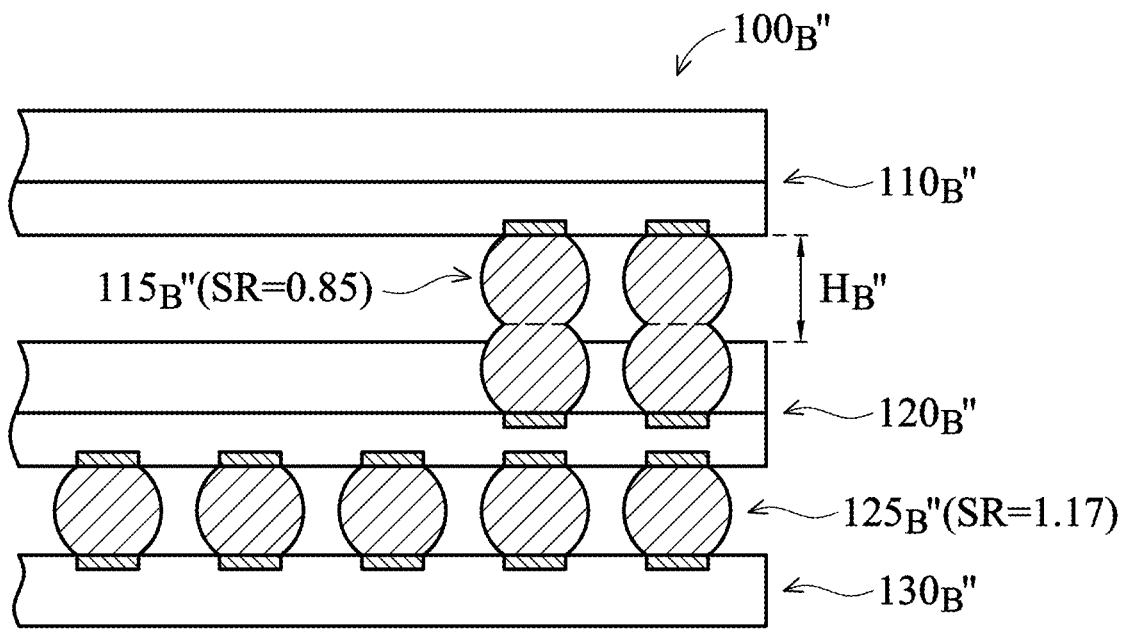

FIG. 6A shows package $100_A"$ having a package $120_A"$ with embedded solder balls, in accordance with some embodiments. Package $100_A"$ is similar to package 100 described above, with the exception that package $120_A"$ has embedded solder balls in molding compound similar to those in FIGS. 2C, 3C and 3E, instead of solder balls being placed in laser drill holes of FIG. 1B. FIG. 6B shows package $100_B"$ having a package $120_B"$ with embedded solder balls, in accordance with some embodiments. Package $100_B"$ is similar to package $100_A"$ with the exception that the solder balls on package $110_B"$ has a volume twice the volume of solder balls on package $110_A"$. As a result, the height $H_B"$ of FIG. 6B is larger than height $H_A"$ of FIG. 6A. Stress simulation shows that if the stress at the corner connector $125_A"$ is used as a reference value (stress ratio is 1), the stress ratio (or SR) of connector $115_A"$ is 1.2. In contrast, the stress ratio of corner connector $125_B"$ of FIG. 6B is 1.17, which is higher than the stress ratio of 1 for corner connector $125_A"$ of FIG. 6A. In addition, the stress ratio of connector $115_B"$ is 0.85, which is lower than the stress ratio 1.2 of connector $115_B"$.

The difference in stress ratios between the two structures is due to additional solder volume from package $110_B"$ (2× the solder volume of package 110') and larger height $H_B"$ than $H_A"$. In some embodiments, the volume of solder material in the solder ball on package $110_A"$ or $110_B"$ is set to allow the optimized production yield. For example, if the risk of solder ball cracking on corner connectors, such as $125_B"$ due to its high stress, it is desirable to choose the structure in FIG. 6A with lower solder volume on package $110_A"$ and lower package on package height $H_A"$. On the other hand, if solder cracking of corner connectors $125_B"$ is not a concern and solder cracking of connector $125_A"$ is an issue, the structure in FIG. 6B should be chosen. Because FIG. 6B has lower stress on connector $115_A"$. The stress results described above is simulated by using ANSYS stress simulator.

Figure 7A:
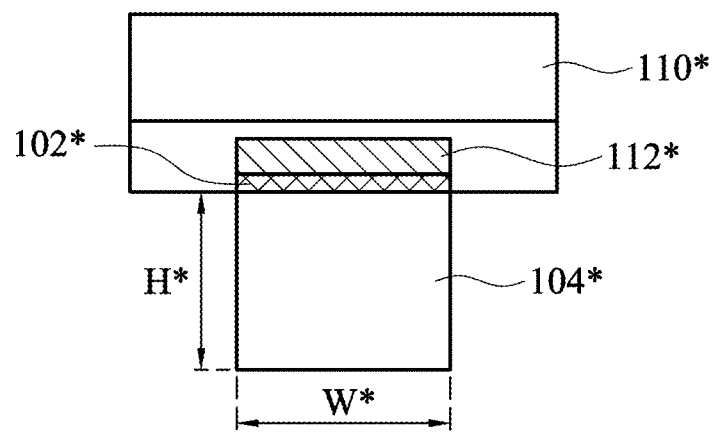
FIGS. 7A, 7B and 7C show various exemplary embodiments of contacts on a package.
Figure 7B:
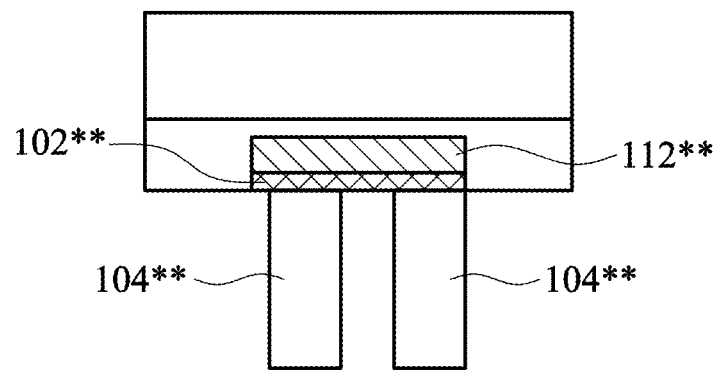
Figure 7C:
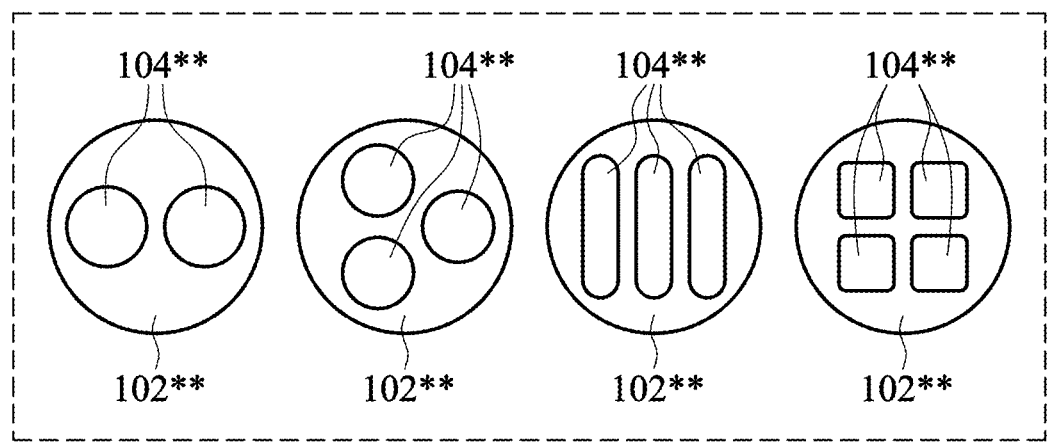

The package structures described above in FIGS. 3A-3D and 6A-6B show upper packages $110_A$, $110_B$, $110_A"$ and $110_B"$ have contacts 104, which are solder balls and are bonded to conductive elements 117', 117" of lower package 120A, 120B, $120_A"$, and $120_B"$. However, contacts 104 can be made of other conductive materials and shapes. For example, contacts 104* may be copper pillars, as shown in FIG. 7A in accordance with some embodiments. Copper pillars 104* may be formed on an UBM layer 102*, which covers metal pad 112*, in accordance with some embodiments. The width of copper pillar 104* (W*) is in a range from about 100 μm to about 250 μm in some embodiments. The height of copper pillar 104* (H*) is in a range from about 10 μm to about 200 μm in some embodiments. Alternatively, contacts 104** may be copper pillars having a width smaller than that of the UBM layer 102*, as shown in FIG. 7B in accordance with some embodiments. There could be two or more such smaller copper pillars on an UBM layer 102, which covers metal pad 112, in accordance with some embodiments. FIG. 7C shows various top views of copper pillar 104, in accordance with some embodiments. As shown in FIG. 7C, there could two or more contacts 104 with contacts 104 in various shapes. For example, the contacts 104" could be circular columns, elongated columns, or square columns with rounded corners. The embodiments shown in FIG. 7C are merely examples. Other configurations are also possible. For example, the UBM layer 102** might not be circular and could be in other shapes.

The described embodiments of mechanisms of forming connectors for package on package enable smaller connectors with finer pitch, which allow smaller package size and additional connections compared to existing connectors. The conductive elements on one package are partially embedded in the molding compound of the package to bond with contacts or metal pads on another package. By embedding the conductive elements, the conductive elements may be made smaller and there is no gap between the conductive elements and the molding compound. A pitch of the connectors can be determined by adding a space margin to a maximum width of the connectors. Various types of contacts on the other package can be bonded to the conductive elements.

An aspect of this description relates to a semiconductor device. The semiconductor device includes a first semiconductor die package. The first semiconductor package includes a molding compound, and a conductive element in the molding compound, wherein a top surface of the conductive element is above or co-planar with a top-most surface of the molding compound. The semiconductor device further includes a second semiconductor die package.

The second semiconductor package includes a plurality of copper-containing contacts on a single metal pad, wherein each of the plurality of copper-containing contacts is bonded to the conductive element. In some embodiments, at least one copper-containing contact of the plurality of copper-containing contacts has a shape selected from the group consisting of circular columns, elongated columns and square columns with rounded corners. In some embodiments, the top surface of the conductive element protrudes from the molding compound. In some embodiments, a maximum width of the conductive element exposed by the molding compound ranges from about 100 microns (μm) to about 400 μm. In some embodiments, an entire sidewall of the conductive element directly contacts the molding compound. In some embodiments, each of the plurality of copper-containing contacts has a same shape.

An aspect of this description relates to a semiconductor device. The semiconductor device includes a molding compound. The semiconductor device further includes a first conductive element embedded in the molding compound, wherein the conductive element is exposed at the top surface of the molding compound. The semiconductor device further includes a metal pad, wherein the metal pad contacts the conductive element and electrically connects to a semiconductor die. The semiconductor device further includes a package including a second conductive element protruding from a surface of the package, wherein the first conductive element is bonded to the second conductive element. In some embodiments, the second conductive element includes a copper pillar. In some embodiments, the second conductive element includes a plurality of copper pillars. In some embodiments, an interface of the first conductive element and the second conductive element has a width in a first direction parallel to a top surface of the molding compound, and the width is less than at least one of a maximum width of the first conductive element in the first direction or a maximum width of the second conductive element in the first direction. In some embodiments, the interface is coplanar with the top surface of the molding compound. In some embodiments, the interface is spaced from the top surface of the molding compound. In some embodiments, a stress ratio of the second conductive element ranges from 0.85 to 1.2.

An aspect of this description relates to a semiconductor device. The semiconductor device includes a semiconductor die. The semiconductor device further includes a molding compound, wherein the semiconductor die is embedded in the molding compound. The semiconductor device further includes a first metal pad, wherein the metal pad is electrically connected to the semiconductor die. The semiconductor device further includes a package comprising a second metal pad. The semiconductor device further includes a conductive bonding element extending between the first metal pad and the second metal pad, wherein the conductive bonding element is partially embedded in the molding compound. The conductive bonding element includes a first portion having a first maximum width in a first direction parallel to a top surface of the molding compound, a second portion having a second maximum width in the first direction, and an interface between the first portion and the second portion, wherein a width of the waist is less than the first maximum width and the second maximum width. In some embodiments, an entirety of the first portion is embedded in the molding compound. In some embodiments, the first portion protrudes from the molding compound. In some embodiments, the interface is coplanar with the top surface of the molding compound. In some embodiments, the interface is spaced from the top surface of the molding compound in a second direction perpendicular to the first direction. In some embodiments, an entirety of a sidewall of the first portion is in direct contact with the molding compound. In some embodiments, a stress ratio of the second portion ranges from 0.85 to 1.2.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
    a first semiconductor die package, wherein the first semiconductor package comprises:
        a molding compound, and
        a conductive element in the molding compound, wherein a top surface of the conductive element is above or co-planar with a top-most surface of the molding compound; and
    a second semiconductor die package, wherein the second semiconductor package comprises:
        a plurality of copper-containing contacts on a single metal pad, wherein each of the plurality of copper-containing contacts is bonded to the conductive element.

2. The semiconductor device of claim 1, wherein at least one copper-containing contact of the plurality of copper-containing contacts has a shape selected from the group consisting of circular columns, elongated columns and square columns with rounded corners.

3. The semiconductor device of claim 1, wherein the top surface of the conductive element protrudes from the molding compound.

4. The semiconductor device of claim 1, wherein a maximum width of the conductive element exposed by the molding compound ranges from about 100 microns (μm) to about 400 μm.

5. The semiconductor device of claim 1, wherein an entire sidewall of the conductive element directly contacts the molding compound.

6. The semiconductor device of claim 1, wherein each of the plurality of copper-containing contacts has a same shape.

7. A semiconductor device, comprising:
    a molding compound;
    a first conductive element embedded in the molding compound, wherein the conductive element is above a top-most surface of the molding compound;

a metal pad, wherein the metal pad contacts the conductive element and electrically connects to a semiconductor die; and a package comprising a second conductive element protruding from a surface of the package, wherein the first conductive element is bonded to the second conductive element.

8. The semiconductor device of claim 7, wherein the second conductive element comprises a copper pillar.

9. The semiconductor device of claim 7, wherein the second conductive element comprises a plurality of copper pillars.

10. The semiconductor device of claim 7, wherein an interface of the first conductive element and the second conductive element has a width in a first direction parallel to a top surface of the molding compound, and the width is less than at least one of a maximum width of the first conductive element in the first direction or a maximum width of the second conductive element in the first direction.

11. The semiconductor device of claim 10, wherein the first conductive element comprises a solder ball.

12. The semiconductor device of claim 10, wherein the interface is spaced from the top surface of the molding compound.

13. The semiconductor device of claim 7, wherein a stress ratio of the second conductive element ranges from 0.85 to 1.2.

14. A semiconductor device, comprising:
a semiconductor die;
a molding compound, wherein the semiconductor die is embedded in the molding compound;
a first metal pad, wherein the metal pad is electrically connected to the semiconductor die;
a package comprising a second metal pad; and
a conductive bonding element extending between the first metal pad and the second metal pad, wherein the conductive bonding element is partially embedded in the molding compound, and the conductive bonding element comprises:
a first portion having a first maximum width in a first direction parallel to a top surface of the molding compound,
a second portion having a second maximum width in the first direction, wherein a stress ratio of the second portion ranges from 0.85 to 1.2, and
an interface between the first portion and the second portion, wherein a width of a waist is less than the first maximum width and the second maximum width.

15. The semiconductor device of claim 14, wherein an entirety of the first portion is embedded in the molding compound.

16. The semiconductor device of claim 14, wherein the first portion protrudes from the molding compound.

17. The semiconductor device of claim 14, wherein the interface is coplanar with the top surface of the molding compound.

18. The semiconductor device of claim 14, wherein the interface is spaced from the top surface of the molding compound in a second direction perpendicular to the first direction.

19. The semiconductor device of claim 14, wherein an entirety of a sidewall of the first portion is in direct contact with the molding compound.

20. The semiconductor device of claim 14, wherein the second portion comprises a copper pillar.

* * * * *